(12) United States Patent
Kim et al.

(10) Patent No.: US 8,058,666 B2
(45) Date of Patent: Nov. 15, 2011

(54) SEMICONDUCTOR LIGHT EMITTING DEVICE AND LIGHT EMITTING APPARATUS HAVING THE SAME

(75) Inventors: Kyung Jun Kim, Gwangju (KR); Hyo Kun Son, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 472 days.

(21) Appl. No.: 12/188,755

(22) Filed: Aug. 8, 2008

(65) Prior Publication Data

US 2009/0039371 A1    Feb. 12, 2009

(30) Foreign Application Priority Data

Aug. 9, 2007 (KR) .................. 10-2007-0079893

(51) Int. Cl.
*H01L 33/00* (2010.01)
(52) U.S. Cl. ...... 257/99; 257/79; 257/94; 257/E33.001; 257/E33.034

(58) Field of Classification Search ............. 257/99, 257/79, 94, E33.001, E33.034
See application file for complete search history.

(56) References Cited

U.S. PATENT DOCUMENTS

| | | | |
|---|---|---|---|
| 6,255,129 B1 * | 7/2001 | Lin | 438/26 |
| 2006/0091417 A1 * | 5/2006 | Sugimoto et al. | 257/99 |
| 2007/0122994 A1 * | 5/2007 | Sonobe et al. | 438/426 |
| 2008/0230793 A1 * | 9/2008 | Yoon et al. | 257/94 |

* cited by examiner

*Primary Examiner* — Long Tran
(74) *Attorney, Agent, or Firm* — Birch, Stewart, Kolasch & Birch, LLP

(57) ABSTRACT

A semiconductor light emitting device and a light emitting apparatus having the semiconductor light emitting device are provided. The semiconductor light emitting device comprises a substrate, a light emitting structure on the substrate, comprising a first conductive type semiconductor layer, an active layer, a second conductive type semiconductor layer, and a first electrode unit on sidewalls of the substrate and the first conductive type semiconductor layer.

19 Claims, 6 Drawing Sheets

SEMICONDUCTOR LIGHT EMITTING DEVICE AND LIGHT EMITTING APPARATUS HAVING THE SAME

CROSS-REFERENCE TO RELATED APPLICATIONS

The present application claims priority under 35 U.S.C. 119 to Korean Patent Application No. 10-2007-0079893 (filed on Aug. 9, 2007), which is hereby incorporated by reference in its entirety.

BACKGROUND

The present disclosure relates to a semiconductor light emitting device and light emitting apparatus having the same.

Group III-V nitride semiconductors have been variously applied to optical devices such as blue and green light emitting diodes (LEDs), high speed switching devices such as a MOSFET (Metal Semiconductor Field Effect Transistor) and an HEMT (Hetero junction Field Effect Transistor), and light sources of lighting devices or display devices.

The nitride semiconductor is mainly used for the LED or an LD (Laser Diode), and studies have been continuously conducted to improve the manufacturing process or a light efficiency of the nitride semiconductor.

SUMMARY

Embodiments provide a light emitting device that is designed to form a first electrode unit on a sidewall thereof and a light emitting apparatus having the light emitting device.

Embodiments provide a semiconductor light emitting device that is designed to form a first electrode unit on a sidewall of a substrate and a first conductive type semiconductor layer and a light emitting apparatus having the light emitting device.

Embodiments provide a semiconductor light emitting device that can form a first electrode unit on a lower-sidewall and a bottom surface thereof, and a light emitting apparatus having the light emitting device.

Embodiments provide a semiconductor light emitting device in which a first electrode unit near a bottom side thereof is mounted on a first electrode lead and a second electrode layer near the light emitting device side is mounted on a second lead electrode using a wire, and a light emitting apparatus having the light emitting device.

An embodiment provides a semiconductor light emitting device comprising: a substrate; a light emitting structure on the substrate, comprising a first conductive type semiconductor layer, an active layer, a second conductive type semiconductor layer; and a first electrode unit on sidewalls of the substrate and the first conductive type semiconductor layer.

An embodiment provides a semiconductor light emitting device comprising: a substrate; a light emitting structure on the substrate, comprising a first conductive type semiconductor layer, an active layer, a second conductive type semiconductor layer; and a first electrode unit comprising a bottom layer on a bottom of the substrate and a sidewall layer on sidewalls of the substrate and the first conductive type semiconductor layer; and a second electrode layer on a second conductive type semiconductor layer.

An embodiment provides a light emitting apparatus comprising: a semiconductor light emitting device comprising a first electrode unit on a lower sidewall and a bottom side therof and a second electrode layer on an upper side thereof; a first electrode lead under the first electrode unit of the bottom side of the semiconductor light emitting device; and a second electrode lead electrically connected to the second electrode layer of the semiconductor light emitting device.

The details of one or more embodiments are set forth in the accompanying drawings and the description below. Other features will be apparent from the description and drawings, and from the claims.

DETAILED DESCRIPTION OF THE EMBODIMENTS

Reference will now be made in detail to the embodiments of the present disclosure, examples of which are illustrated in the accompanying drawings.

Figure 1:
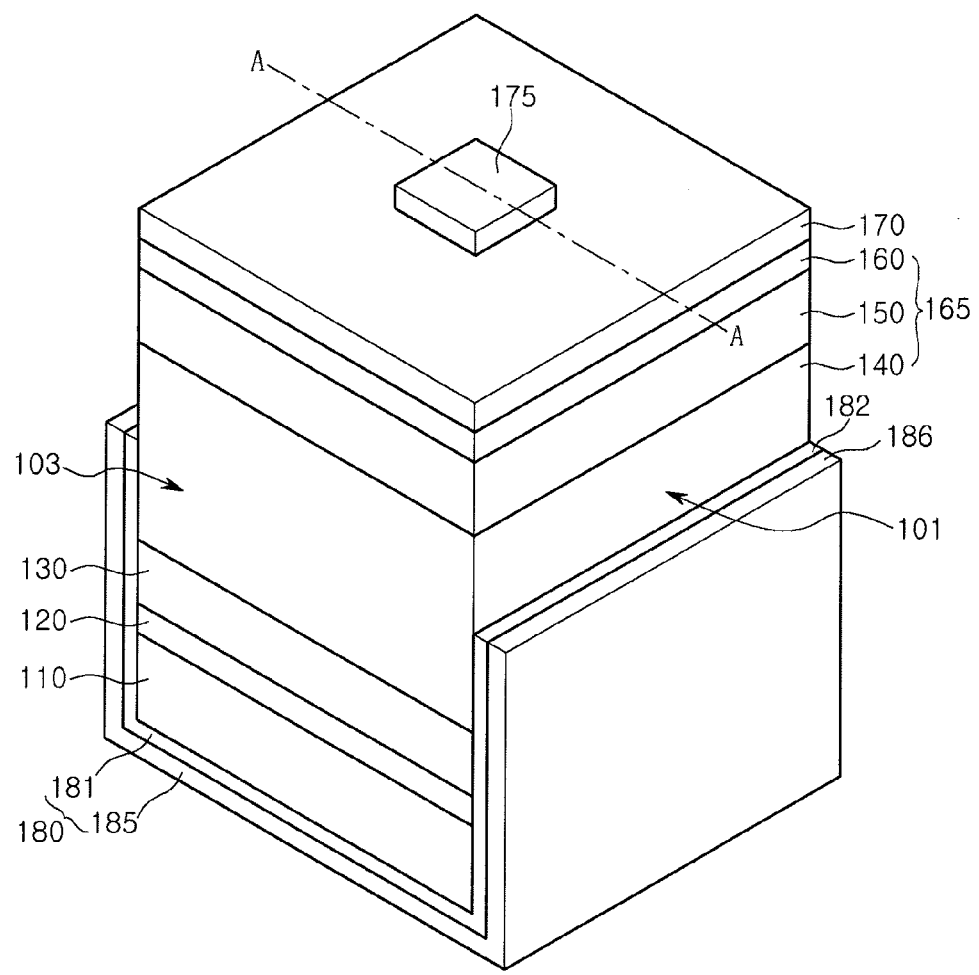
FIG. 1 is a perspective view of a semiconductor light emitting device according to a first embodiment.
Figure 2:
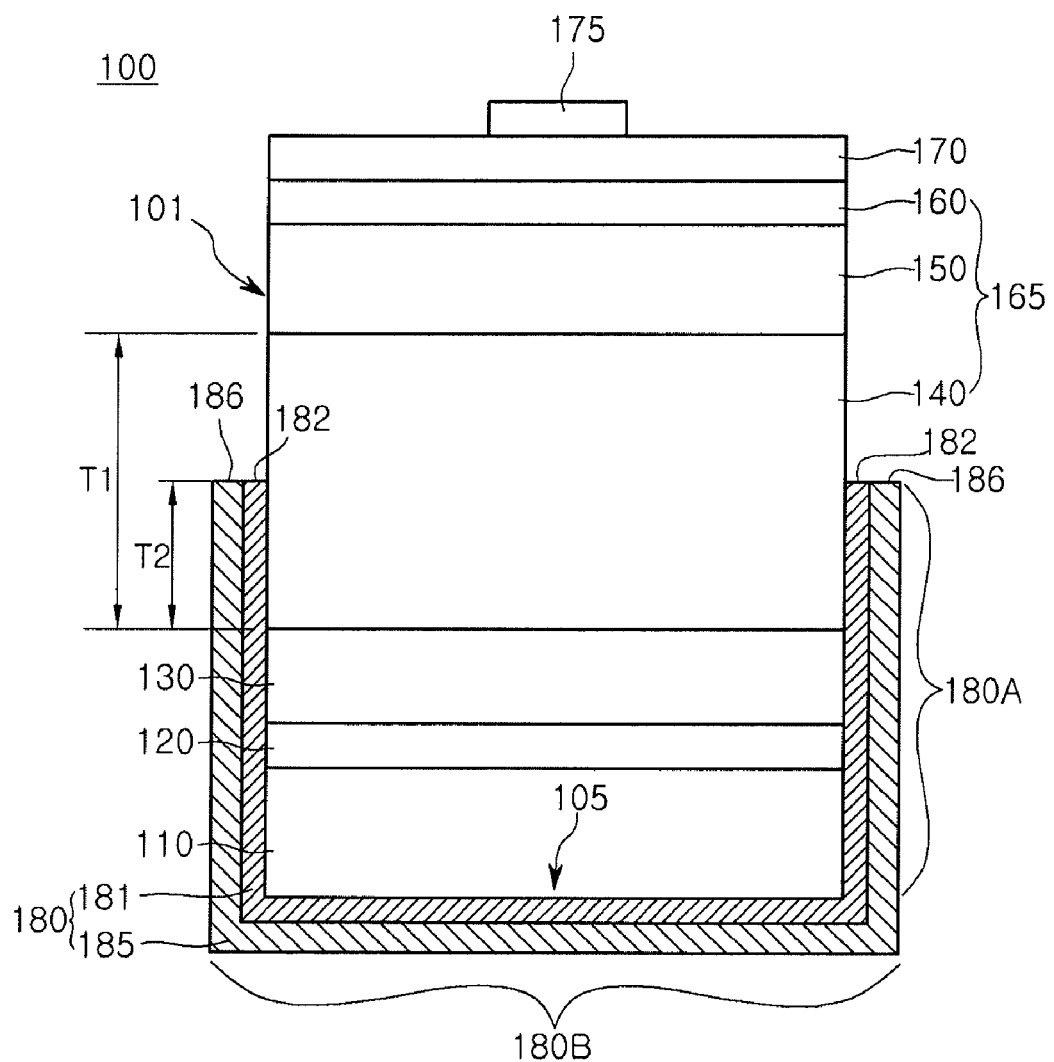
FIG. 2 is a side sectional view taken along line A-A of FIG. 1.

FIG. 1 is a perspective view of a semiconductor light emitting device according to a first embodiment, and FIG. 2 is a side sectional view taken along line A-A of FIG. 1.

Referring to FIGS. 1 and 2, a light emitting device 100 comprises a substrate 110, a buffer layer 120, an undoped semiconductor layer 130, a first conductive type semiconductor layer 140, an active layer 150, a second conductive type semiconductor layer 160, a transparent electrode layer 170, a first electrode layer 180, and a second electrode layer 175.

The substrate 110 may be formed of a material selected from the group consisting of sapphire ($Al_2O_3$), GaN, SiC, ZnO, Si, GaP, GaAs, and a combination thereof. In the embodiment, the substrate 110 may be a conductive substrate such as a sapphire substrate.

A nitride semiconductor is grown on the substrate 110. At this point, a physical vapor deposition apparatus, a chemical vapor deposition apparatus, a plasma laser deposition apparatus, a dual-type thermal evaporator sputtering apparatus, a metal organic chemical vapor deposition apparatus, and the like are used as a growing apparatus.

The buffer layer 120 is formed on the substrate 110 and the undoped semiconductor layer 130 is formed on the buffer layer 120. Here, the buffer layer 120 is for reducing a lattice constant difference from the substrate 110. The buffer layer 120 may be a GaN buffer layer, an AlN buffer layer, an AlGaN buffer layer, or an InGaN buffer layer. The undoped semiconductor layer 130 may be an undoped GaN layer to function as a substrate on which the nitride semiconductor is grown.

At least one of the buffer layer 120 and the undoped semiconductor layer 130 may be omitted.

The first conductive type semiconductor layer 140 is formed on the undoped semiconductor layer 130 and doped with first conductive dopants to function as an electrode contacting layer. The first conductive type semiconductor layer 140 may be realized as an N-type semiconductor layer. The N-type semiconductor layer may be formed of a III and V group compound such as $In_xAl_yGa_{1-x-y}N$ ($0 \leq x \leq 1$, $0 \leq y \leq 1$, $0 \leq x+y \leq 1$). That is, the N-type semiconductor layer may be formed of a material selected from the group consisting of GaN, InN, AlN, InGaN, AlGaN, InAlGaN, AlInN, and a combination thereof and provided in the formed of binary, ternary, or quaternary. The first conductive dopants are N-type dopants that comprise II-group elements such as Si, Ge, Sn, Te, and Se.

The first conductive type semiconductor layer 140 may have a thickness of 3~30 um. The thickness T1 may be formed with a thickness 3-6 times an N-type semiconductor of a typical LED structure.

Here, a semiconductor layer doped with dopants may be further formed between the undoped semiconductor layer 130 and the first conductive type semiconductor layer 140. However, the present disclosure is not limited to this.

The active layer 150 is formed on the first conductive type semiconductor layer 140. The active layer 150 has a single or multi-quantum well structure. The active layer 150 may be formed of, for example, a cycle of an InGaN well structure and a GaN barrier layer. However, the present disclosure is not limited to this. The light emitting material of the active layer 150 may be altered in accordance with a wavelength of light, such as blue, red, green wavelengths.

A conductive clad layer (not shown) may be formed on or under the active layer 150. The conductive clad layer may be an AlGaN layer.

The second conductive type semiconductor layer 160 is formed on the active layer 150. The second conductive type semiconductor layer 160 is doped with second conductive dopants to function as an electrode contacting layer. The second conductive type semiconductor layer 160 may be a P-type semiconductor layer that may be formed of a material selected from the group consisting of GaN, InN, AlN, InGaN, AlGaN, InAlGaN, AlInN, and a combination thereof. The second conductive dopants are P-type dopants that may be selected from the group consisting of Mg, Zn, Ca, Sr, Ba, and a combination thereof.

A third conductive type semiconductor layer (not shown) that is an N-type semiconductor layer may be formed on the second conductive type semiconductor layer 160. In this embodiment, although it is described that the first conductive type semiconductor layer 140 is the N-type semiconductor layer and the second conductive type semiconductor layer 160 is the P-type semiconductor layer, it is also possible to form an inverse structure to this structure. In addition, the light emitting structure 165 may be one of a P-N junction structure, an N-P junction structure, a P-N-P junction structure, and an N-P-N junction structure.

The transparent electrode layer 170 is formed on the second conductive type semiconductor layer 160 and the second electrode layer 175 is formed on the transparent electrode layer 170. Here, the transparent electrode layer 170 is a transmittable oxide layer formed of a material selected from the group consisting of ITO, ZnO, RuOx, TiOx, IrOx, and a combination thereof. When the light emitting structure is the N-P-N junction structure, the transparent electrode layer 170 may be formed on the third conductive type semiconductor layer that is the N-type semiconductor layer.

The second electrode layer 175 comprises a second electrode pad that may be formed in a single or multi-layer using Ti, Au, Pd, Ni, or an alloy thereof. The second electrode layer 175 may be formed in a stacked structure of a second reflective electrode (not shown) and a second electrode pad (not shown). The second reflective electrode may be formed in a single or multi-layer using Al, Ag, Pd, Rh, Pt, and an alloy thereof. The second electrode pad may be formed on the second reflective electrode.

A first electrode unit 180 is formed on a lower-outer surface of the light emitting device 100. The first electrode unit 180 may be formed on opposite two sidewalls among the sidewalls of the light emitting device 100. In addition, the first electrode unit 180 may be formed on one sidewall, left and right sidewalls 101, or/and front and rear walls (103).

The first electrode unit 180 comprises a sidewall layer 180A and a bottom layer 180B. The sidewall layer 180A is formed on sidewalls of the substrate 110, buffer layer 120, undoped semiconductor layer 130, and first conductive type semiconductor layer 140. The sidewall layer 180A may be formed on the opposite two sidewalls 101 among the four sidewalls of the light emitting device 100. However, the present disclosure is not limited to this configuration.

The sidewall layer 180A of the first electrode unit may extend from a lower end of the first conductive type semiconductor layer 140 to a predetermined height T2. Upper ends and 186 of the sidewall layer 180A of the first electrode unit 180 are higher than lower end of the first conductive type semiconductor layer 140 but lower than the active layer 150.

The bottom layer 180B is electrically connected to the sidewall layer 180A and formed on a bottom surface 105 of the substrate 110.

The first electrode unit 180 comprises a first reflective electrode 181 and a first electrode pad 185. The first reflective electrode 181 is formed in a single or multi-layer of a reflective material such as Al, Ag, Pd, Rh, Pt, and an alloy thereof. The first electrode pad 185 is formed on an outer surface of the first reflective electrode 181 in a single or multi-layer formed of a material selected from the group consisting of Ti, Al, In, Ta, Pd, Co, Ni, Si, Ge, Ag, Au, and a combination thereof.

Here, the first electrode unit 180 may be formed with the first electrode pad 185 without the first reflective electrode 181. In addition, the sidewall layer 180A of the first electrode unit 180 may be a transmittable electrode and the bottom layer 180B may be formed with the first electrode pad 185. The transmittable electrode may be formed of a material selected from the group consisting of ITO, ZnO, RuOx, TiOx, IrOx, SnO2, and a combination thereof. In addition, the first reflective electrode 181 may be formed of a material having ohmic and reflectance properties.

The first electrode unit 180 reflects the light traveling toward the substrate to improve the light emitting efficiency of the light emitting device 100. In addition, the transmittance and reflectance properties of the first electrode unit 180 improve the light emitting efficiency of the semiconductor light emitting device 100.

In addition, since the semiconductor light emitting device 100 is manufactured without performing a mesa etching process, the reduction of the light emitting area of the active layer 150 can be prevented.

Since the first electrode unit 180 supplies the current to the sidewall of the first conductive type semiconductor layer 140, the current can be uniformly diffused through an entire area of the first conductive type semiconductor layer 140. Therefore, the internal quantum efficiency of the active layer 150 can be improved.

Figure 3:
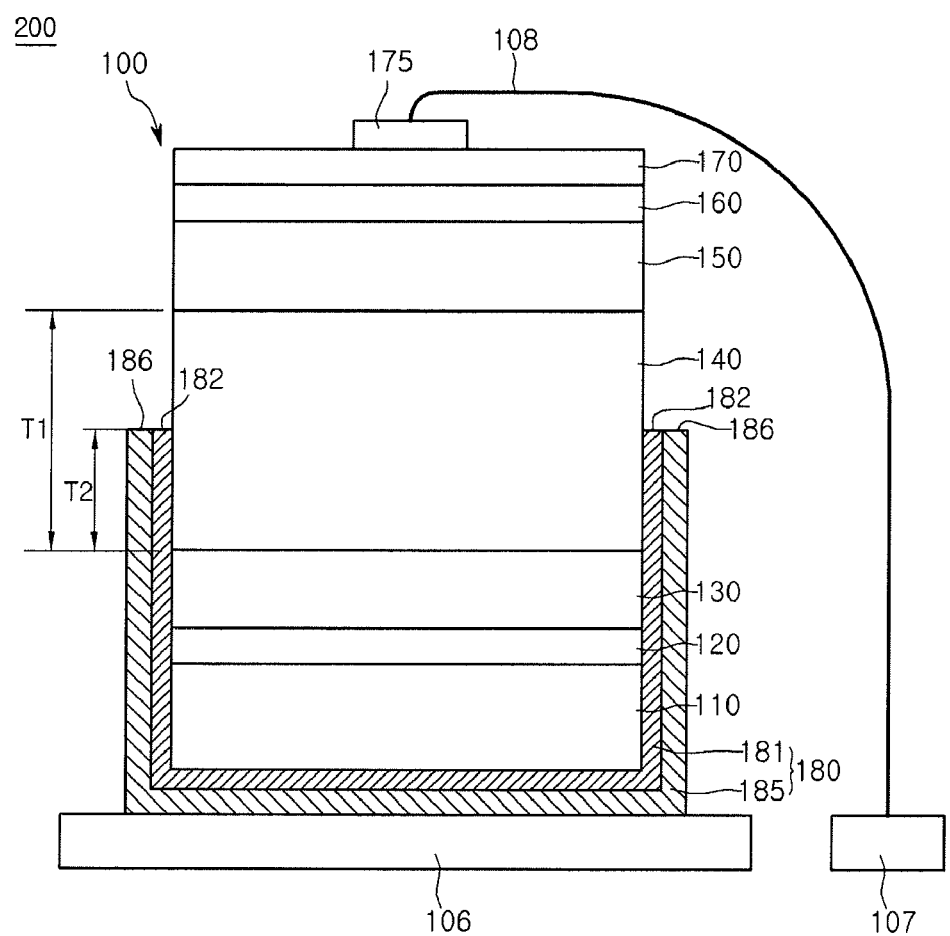
FIG. 3 is a view of a light emitting apparatus having the semiconductor light emitting device of FIG. 1.

FIG. 3 is a view of a light emitting apparatus having the semiconductor light emitting device of FIG. 1.

Referring to FIG. 3, a light emitting apparatus 200 comprises a light emitting device 100, a first electrode lead 106, a second electrode lead 107, and a wire 108.

In the semiconductor light emitting device 100, the first electrode unit 180 near the bottom side is mounted on the first electrode lead 106 by metal paste and the second electrode layer 175 is connected to the second electrode lead 107 by the wire 108. Here, the metal paste may be selected from the group consisting of Cu, Ag, Au, Pd, Pt, Ni, Al, and an alloy thereof. However, the present disclosure is not limited to this. Here, the first and second electrode leads 106 and 107 may be provided in the form of lead frames or plating layer.

Since only one wire is used for the semiconductor light emitting device 100, interference of light emitted from the light emitting device 100 can be reduced.

Figure 4:
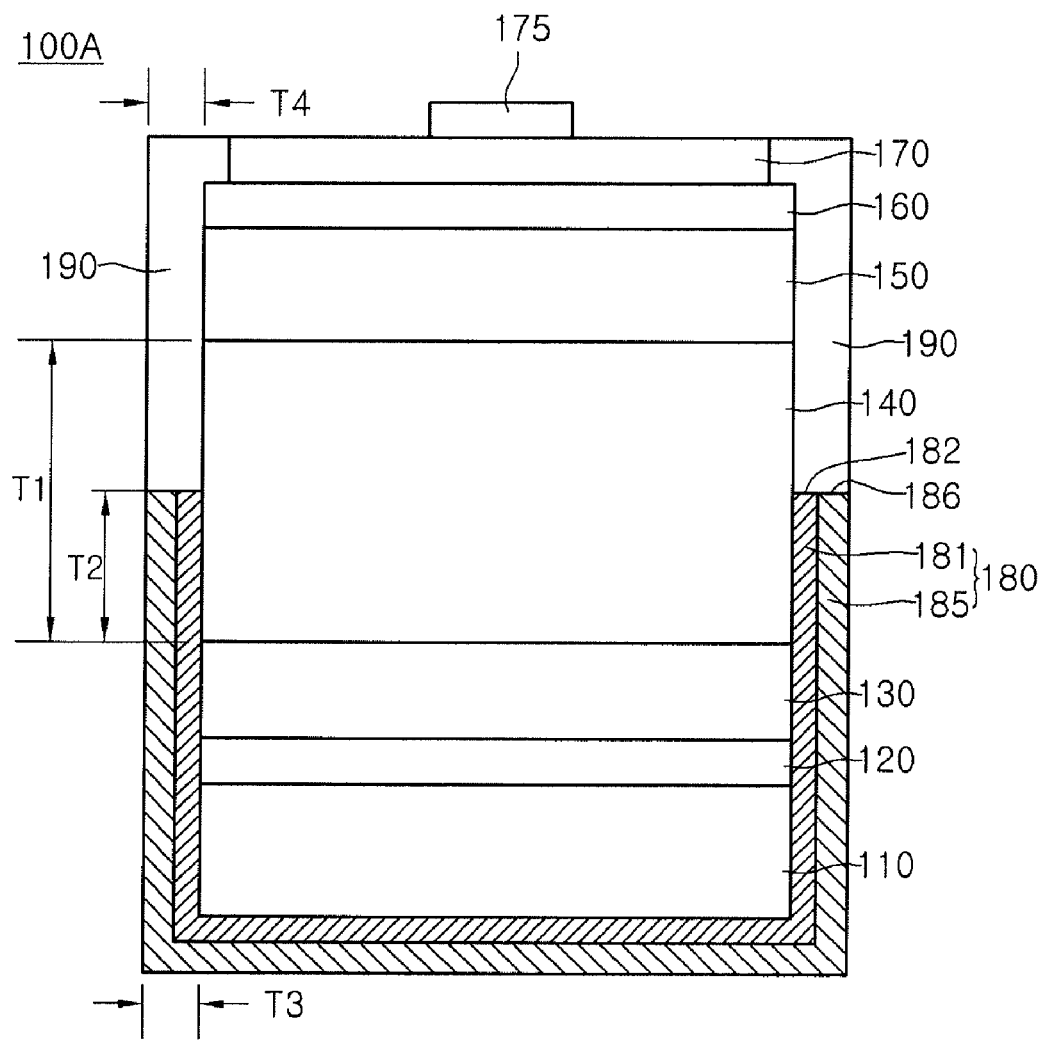
FIG. 4 is a side sectional view of a semiconductor light emitting device according to a second embodiment.

FIG. 4 is a side sectional view of a semiconductor light emitting device according to a second embodiment. In the second embodiment, a description of the same parts as the first embodiment will be omitted.

Referring to FIG. 4, a semiconductor light emitting device 100A comprises a dielectric 190 on an upper-sidewall therof.

The dielectric 190 extends from both ends 182 and 186 of the first electrode unit 180 to a sidewall of the transparent electrode layer 170. The dielectric 190 may further extend up to an outer top surface of the transparent electrode layer 170. That is, the dielectric 190 may extend from an outer-upper portion of the first conductive type semiconductor layer 180 to outer sides of the second conductive type semiconductor layer 160 and transparent electrode layer 170.

A thickness T4 of the dielectric 190 may be same as a thickness T3 of the first electrode unit 180 but not limited to this.

Figure 5:
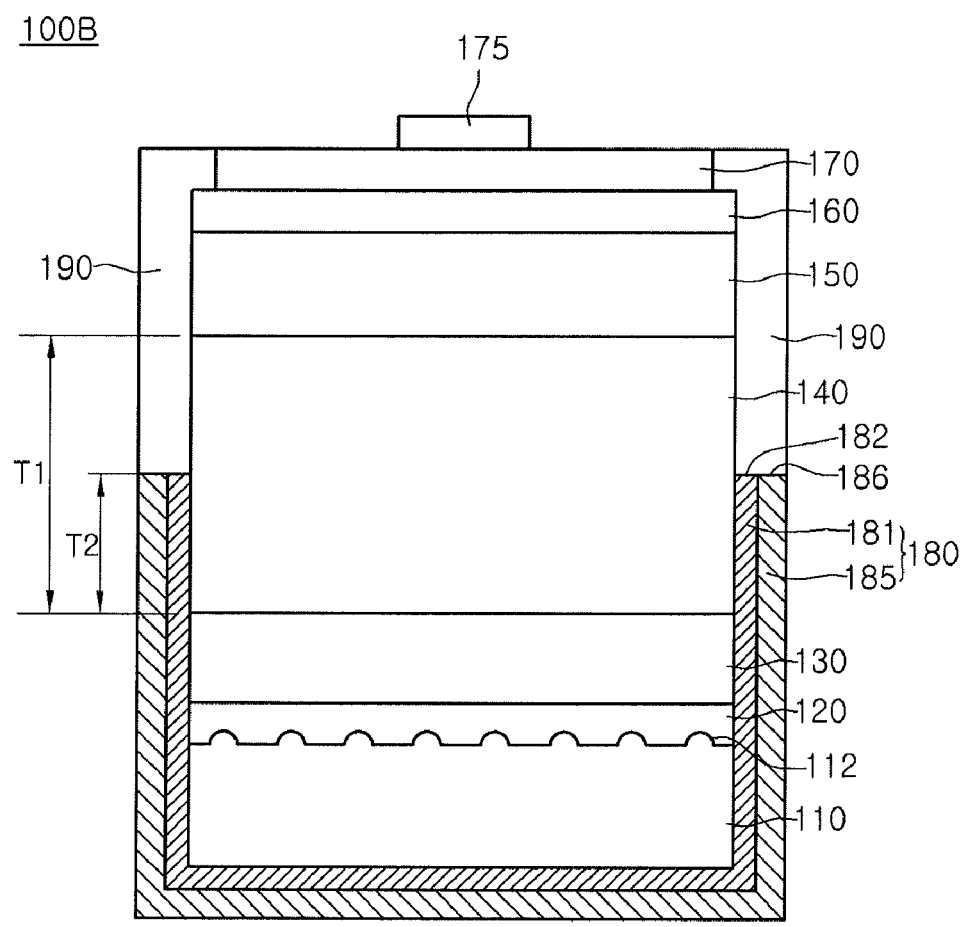
FIG. 5 is a side sectional view of a light emitting device according to a third embodiment.

FIG. 5 is a side sectional view of a semiconductor light emitting device according to a third embodiment. In the third embodiment, a description of the same parts as the first embodiment will be omitted.

Referring to FIG. 5, a semiconductor light emitting device 100B comprises a substrate 110 provided with a protrusion/groove pattern 112. That is, the protrusion/groove pattern 112 is formed on a top surface of the substrate 110 and the protrusion/groove pattern 112 may comprise at least one of a plurality of stripe-shaped protrusions, a plurality of lens-shaped protrusions, and a plurality of a cone-shape protrusions.

Figure 6:
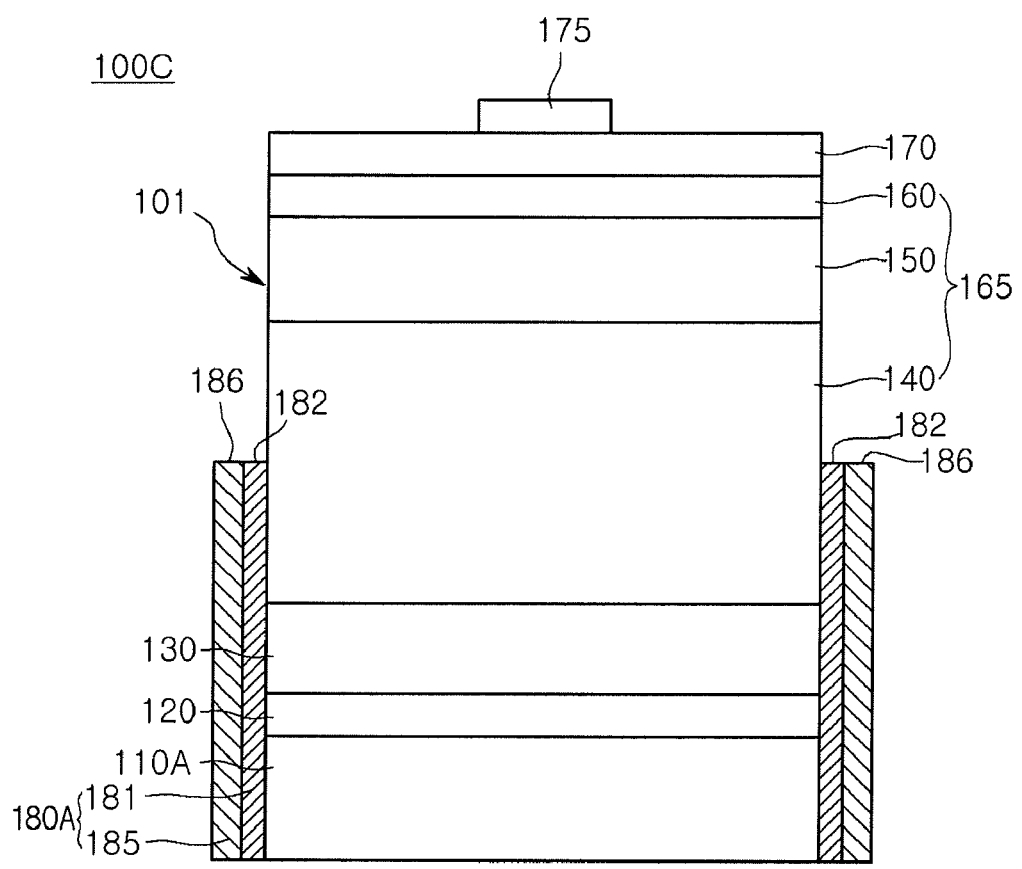
FIG. 6 is a side sectional view of a semiconductor light emitting device according to a fourth embodiment.

FIG. 6 is a side sectional view of a semiconductor light emitting device according to a fourth embodiment. In the fourth embodiment, a description of the same parts as the first embodiment will be omitted.

Referring to FIG. 6, a semiconductor light emitting device 100C comprises a conductive substrate 110A and a first electrode unit 180A formed on a lower sidewall thereof. The conductive substrate 110A is formed of, for example, GaN, GaAs, GaP, InP, and the like.

The first electrode unit 180A is formed on a lower sidewall, extending from a sidewall of the conductive substrate 110A to a lower sidewall of the first conductive type semiconductor layer 140. The first electrode unit 180A may be formed on one sidewall, opposite sidewalls, or all sidewalls.

The first conductive type semiconductor layer 140 may be applied with a current through the conductive substrate 110A and the first electrode unit 180A.

The light emitting devices of the first to fourth embodiments may employ constitutional elements of other embodiments and are not limited to their structures. In addition, since the light emitting device uses only one wire, problems such as a bonding problem and a light interference problem can be solved. In addition, an etching process is not performed for the active layer, the reduction of the light emitting of the active layer can be prevented. Further, by forming the first electrode unit on the lower portion and sidewalls of the substrate, an amount of light reflected can increase.

In the embodiments, since the current is supplied to the first conductive type semiconductor layer through the first electrode unit formed on the sidewall of the light emitting device, the first conductive type semiconductor layer is uniformly applied with the current and thus the light can be emitted from the active layer with a uniform distribution.

In the description, it is understood that when a layer (or film) is referred to as being 'on' another layer or substrate, it can be directly on the other layer or substrate, or intervening layers may also be present. Further, it will be understood that when a layer is referred to as being 'under' another layer, it can be directly under the other layer, and one or more intervening layers may also be present. In addition, "on" and "under" of each layer will be referred based on the drawings. Further, the thickness of each layer is exemplarily illustrated and thus the actual thickness of each layer is not limited to the drawings.

Any reference in this specification to "one embodiment," "an embodiment," "example embodiment," etc., means that a particular feature, structure, or characteristic described in connection with the embodiment is comprised in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor light emitting device comprising:
a substrate;
a light emitting structure disposed on the substrate and comprising a first conductive type semiconductor layer, an active layer on the first conductive type semiconductor layer, and a second conductive type semiconductor layer on the active layer;
a second electrode electrically connected to the second conductive type semiconductor layer;
a first electrode disposed on a lower portion of a sidewall of the first conductive type semiconductor layer; and
a dielectric layer disposed on an upper portion of the sidewall of the first conductive type semiconductor layer and being in contact with an upper portion of the first electrode,
wherein the upper portion of the first electrode is lower than a sidewall of the active layer which generates light.

2. The semiconductor light emitting device according to claim 1, wherein a thickness of the first conductive type semiconductor layer is about 3-30 μm.

3. The semiconductor light emitting device according to claim 1, wherein the substrate comprises a conductive substrate.

4. The semiconductor light emitting device according to claim 1, wherein the substrate comprises a dielectric substrate and the first electrode extends to a bottom surface of the dielectric substrate.

5. The semiconductor light emitting device according to claim 4, wherein the first electrode comprises a reflective electrode and an electrode pad on an outer side of the reflective electrode.

6. The semiconductor light emitting device according to claim 1, comprising at least one of a buffer layer and an undoped semiconductor layer between the substrate and the first conductive type semiconductor layer.

7. The semiconductor light emitting device according to claim 1, wherein the first electrode comprises at least one of a reflective electrode, the reflective electrode including an ohmic property, and a transmittable electrode.

8. The semiconductor light emitting device according to claim 1, wherein the first electrode is disposed on opposite sidewalls among the sidewalls of the substrate and the first conductive type semiconductor layer, and at least one of the sidewalls of the substrate and the first conductive type semiconductor layer are open from the first electrode.

9. The semiconductor light emitting device according to claim 1, comprising a transparent electrode layer disposed between the second electrode and the second conductive type semiconductor layer,
wherein the transparent electrode layer is in contact with a top surface of the second conductive type semiconductor layer.

10. The semiconductor light emitting device according to claim 1, wherein the dielectric layer is extended on sidewalls of the active layer and the second conductive type semiconductor layer.

11. The semiconductor light emitting device according to claim 10, wherein the first electrode is disposed at an entire region of at least one sidewall of the substrate and a portion of the dielectric layer is disposed on the second conductive type semiconductor layer.

12. A light emitting apparatus comprising:
a semiconductor light emitting device comprising a first electrode and a second electrode;
a first electrode lead under the first electrode of the semiconductor light emitting device; and
a second electrode lead electrically connected to the second electrode of the semiconductor light emitting device,
wherein the semiconductor light emitting device comprises:
a substrate;
a light emitting structure disposed on the substrate and comprising a first conductive type semiconductor layer, an active layer on the first conductive type semiconductor layer, and a second conductive type semiconductor layer on the active layer; and
a dielectric layer disposed on an upper sidewall of the first conductive type semiconductor layer and being in contact with an upper portion of the first electrode,
wherein the first electrode is disposed at a sidewall of the first conductive type semiconductor layer and extends to a bottom surface of the substrate, and
the second electrode is in contact with a top surface of the second conductive type semiconductor layer;
the second conductive type semiconductor layer is electrically connected to the active layer and the second electrode,
the active layer is electrically connected to the second conductive type semiconductor layer and the first conductive type semiconductor layer, and
an upper portion of the first electrode is spaced apart from an sidewalls of the active layer and is disposed at an area lower than the sidewall of the active layer.

13. A semiconductor light emitting device comprising:
a substrate;
a light emitting structure disposed on the substrate and comprising a first conductive type semiconductor layer, an active layer on the first conductive type semiconductor layer, and a second conductive type semiconductor layer on the active layer;
a first electrode comprising a bottom layer on a bottom of the substrate and a sidewall layer on sidewalls of the substrate and the first conductive type semiconductor layer; and
a second electrode on a second conductive type semiconductor layer,
wherein an upper portion of the sidewall layer of the first electrode is lower than a sidewall of the active layer which generates light such that the light propagated through side direction of the active layer is not disturbed by the sidewall layer of the first electrode, and
wherein a lower surface of the active layer has a width substantially equal to a width of a lower surface of the first conductive type semiconductor layer.

14. The semiconductor light emitting device according to claim 13, wherein a top of the substrate comprises a protrusion/groove pattern.

15. The semiconductor light emitting device according to claim 13, wherein the first conductive type semiconductor layer comprises an N-type semiconductor layer; and
a thickness of the N-type semiconductor layer is about 3-30 µm.

16. The semiconductor light emitting device according to claim 13, wherein the first electrode comprises a reflective electrode disposed on a bottom of the substrate and disposed on sidewalls of the substrate and the first conductive type semiconductor layer, and an electrode pad on an outer side of the reflective electrode;
the reflective electrode is formed in a single or multi-layer formed of a material selected from the group consisting of Al, Ag, Pd, Rh, Pt, and an alloy thereof; and
the electrode pad is formed in a single or multi-layer formed of a material selected from the group consisting of Ti, Al, In, Ta, Pd, Co, Ni, Si, Ge, Ag, Au, and an alloy thereof.

17. The semiconductor light emitting device according to claim 13, wherein the sidewall layer of the first electrode includes a transmittable electrode and the bottom layer of the first electrode includes an electrode pad.

18. The semiconductor light emitting device according to claim 13, a dielectric layer disposed on sidewalls of the first conductive type semiconductor layer, the active layer and the second conductive type semiconductor layer.

19. The semiconductor light emitting device according to claim 13, comprising a transparent electrode layer between the second conductive type semiconductor layer and second electrode.

* * * * *